(12) United States Patent
Yurchenco et al.

(10) Patent No.: US 9,152,194 B2
(45) Date of Patent: *Oct. 6, 2015

(54) CHARGING CONTACT SYSTEM

(71) Applicant: Qwest Communications International Inc., Denver, CO (US)

(72) Inventors: James Yurchenco, Palo Alto, CA (US); Adam Vollmer, San Francisco, CA (US); Matthew Robert Adams, Mountain View, CA (US); Andrew Switky, Menlo Park, CA (US)

(73) Assignee: Qwest Communications International Inc., Denver, CO (US)

( * ) Notice: Subject to any disclaimer, the term of this patent is extended or adjusted under 35 U.S.C. 154(b) by 197 days.

This patent is subject to a terminal disclaimer.

(21) Appl. No.: 13/722,891

(22) Filed: Dec. 20, 2012

(65) Prior Publication Data

US 2013/0162211 A1 Jun. 27, 2013

Related U.S. Application Data

(60) Provisional application No. 61/580,051, filed on Dec. 23, 2011.

(51) Int. Cl.
*H02J 7/00* (2006.01)
*H01M 2/10* (2006.01)
(Continued)

(52) U.S. Cl.
CPC ................ *G06F 1/26* (2013.01); *G06F 1/1632* (2013.01); *H02J 7/0044* (2013.01); *H01M 2/10* (2013.01); *H01R 12/00* (2013.01); *H05K 1/00* (2013.01); *H05K 5/00* (2013.01); *H05K 7/00* (2013.01)

(58) Field of Classification Search
CPC ............ H02J 7/00; H01M 2/10; H01R 12/00; H01R 4/58; H05K 1/00; H05K 5/00; H05K 7/00; G06F 1/16; G06F 1/20
USPC .......... 320/115, 113; 429/97, 100, 79, 80, 84, 429/89; 361/679.41, 679.43
See application file for complete search history.

(56) References Cited

U.S. PATENT DOCUMENTS 3,810,258 A 5/1974 Mathauser
4,166,663 A 9/1979 Walker et al.
(Continued)

FOREIGN PATENT DOCUMENTS

DE 4009021 A1 * 9/1991 ............... G05G 1/00

OTHER PUBLICATIONS

U.S. Appl. No. 13/722,902, filed Dec. 20, 2012, 34 pages.
(Continued)

*Primary Examiner* — Phallaka Kik
(74) *Attorney, Agent, or Firm* — Swanson & Bratschun, L.L.C.

(57) ABSTRACT

Novel tools and techniques are described for waterproof charging contact system. In one aspect, the charging contact system may comprise docking station comprising a first set of compliant charging contacts for a tablet computer system and a second set of compliant charging contacts for a handset computer. Each compliant charging contact comprises a charging pin pressed into an elastomer diaphragm inserted within a body of the docking station. The tablet computer system comprises a first set of static charging contacts configured to mate with the first set of compliant charging contacts. The handset comprises a second set of static charging contacts configured to mate with the second set of compliant charging contacts.

20 Claims, 3 Drawing Sheets

(51) Int. Cl.
  *H01R 12/00*  (2006.01)
  *H01R 4/58*   (2006.01)
  *H05K 1/00*   (2006.01)
  *H05K 5/00*   (2006.01)
  *H05K 7/00*   (2006.01)
  *G06F 1/16*   (2006.01)
  *G06F 1/20*   (2006.01)
  *G06F 1/26*   (2006.01)

(56) References Cited

U.S. PATENT DOCUMENTS

| | | | |
|---|---|---|---|
| 5,573,107 | A | 11/1996 | Nakano et al. |
| 7,311,526 | B2 | 12/2007 | Rohrbach et al. |
| 7,341,458 | B1 | 3/2008 | Koh |
| 7,775,801 | B2 | 8/2010 | Shiff et al. |
| 7,839,120 | B2 | 11/2010 | Elizalde Rodarte |
| 7,957,326 | B1 | 6/2011 | Christie, IV |
| 8,535,088 | B2 | 9/2013 | Gao et al. |
| 8,907,781 | B2 * | 12/2014 | Tomooka et al. ......... 340/539.1 |
| 8,940,424 | B2 * | 1/2015 | Joye et al. ...................... 429/98 |
| 9,083,111 | B2 | 7/2015 | Riering-Czekalla et al. |
| 2001/0001083 | A1 | 5/2001 | Helot |
| 2002/0078291 | A1 * | 6/2002 | Sutton et al. ................. 710/302 |
| 2002/0117789 | A1 * | 8/2002 | Childers et al. .......... 267/140.14 |
| 2002/0160806 | A1 | 10/2002 | Arazi et al. |
| 2003/0059024 | A1 | 3/2003 | Meyerson et al. |
| 2003/0104714 | A1 * | 6/2003 | Yeh ................................. 439/79 |
| 2003/0235029 | A1 * | 12/2003 | Doherty et al. ............... 361/683 |
| 2005/0174727 | A1 * | 8/2005 | Thomas et al. ............... 361/681 |
| 2006/0185822 | A1 * | 8/2006 | Glezer et al. ................ 165/80.3 |
| 2007/0263828 | A1 | 11/2007 | Lee et al. |
| 2007/0297426 | A1 | 12/2007 | Haveson et al. |
| 2008/0004002 | A1 | 1/2008 | Chin et al. |
| 2008/0058010 | A1 | 3/2008 | Lee |
| 2008/0081580 | A1 | 4/2008 | Cole |
| 2008/0231545 | A1 | 9/2008 | Gong |
| 2009/0143053 | A1 | 6/2009 | Levien et al. |
| 2009/0233542 | A1 | 9/2009 | Gratton et al. |
| 2009/0320073 | A1 | 12/2009 | Reisman |
| 2010/0118158 | A1 | 5/2010 | Boland et al. |
| 2010/0131691 | A1 | 5/2010 | Chatterjee et al. |
| 2010/0203833 | A1 | 8/2010 | Dorsey |
| 2011/0053643 | A1 | 3/2011 | Shmunis |
| 2011/0276885 | A1 | 11/2011 | Gibson et al. |
| 2012/0057295 | A1 * | 3/2012 | Simpson et al. ......... 361/679.44 |
| 2012/0293924 | A1 * | 11/2012 | Dolci et al. .............. 361/679.01 |
| 2012/0303476 | A1 * | 11/2012 | Krzyzanowski et al. .... 705/26.5 |
| 2013/0107445 | A1 * | 5/2013 | Reber et al. .............. 361/679.41 |
| 2013/0164949 | A1 | 6/2013 | Riering-Czekalla et al. |
| 2013/0279109 | A1 * | 10/2013 | Lindblad et al. ......... 361/679.43 |
| 2014/0295758 | A1 * | 10/2014 | Pedersen ...................... 455/41.2 |

OTHER PUBLICATIONS

U.S. Appl. No. 13/722,908, filed Dec. 20, 2012, 33 pages.
U.S. Appl. No. 12/773,742; NonFinal Office Action dated May 20, 2013; 29 pages.
U.S. Appl. No. 12/773,742; Final Office Action dated Nov. 7, 2013; 67 pages.
U.S. Appl. No. 12/773,742; NonFinal Office Action dated Apr. 23, 2014; 36 pages.
U.S. Appl. No. 13/722,902; Notice of Publication dated Jun. 27, 2013; 1 page.
U.S. Appl. No. 12/773,742; NonFinal Office Action dated Jan. 15, 2015; 42 pages.
U.S. Appl. No. 13/722,902; Notice of Allowance dated Mar. 19, 2015; 16 pages.
U.S. Appl. No. 12/773,742; Notice of Publication dated Nov. 10, 2011; 1 page.
U.S. Appl. No. 12/773,742; Final Office Action dated Aug. 13, 2014; 26 pages.
U.S. Appl. No. 13/722,902; NonFinal Office Action dated Oct. 15, 2014; 9 pages.
U.S. Appl. No. 12/773,742; Final Office Action dated Aug. 14, 2015; 37 pages.

* cited by examiner

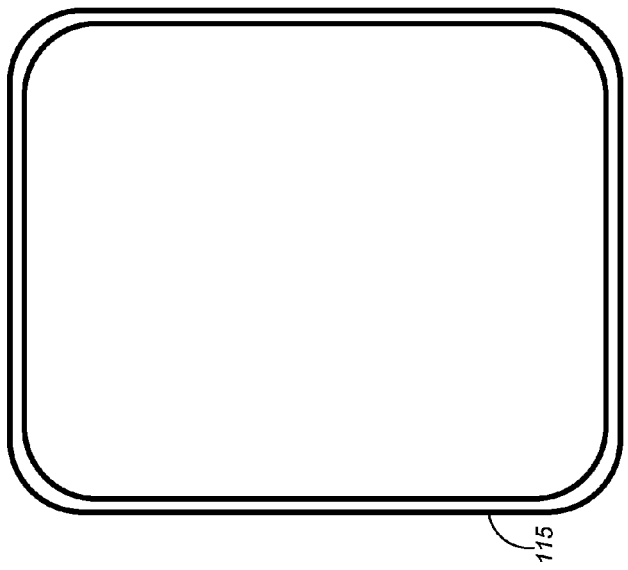
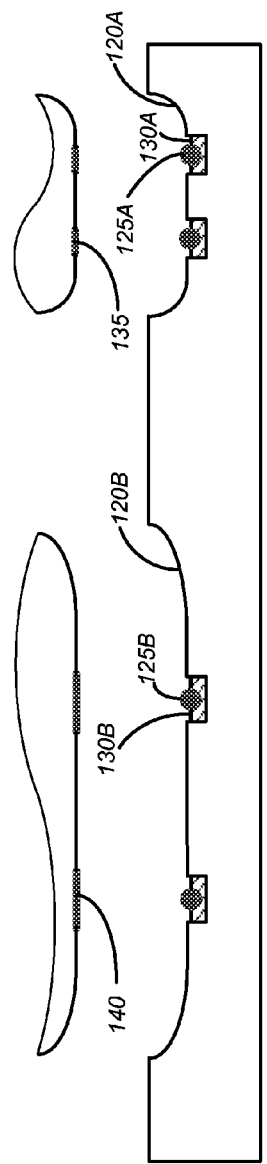
Fig. 2A
Fig. 2B

CHARGING CONTACT SYSTEM

CROSS-REFERENCES TO RELATED APPLICATIONS

This application claims priority to U.S. Provisional Patent Application No. 61/580,051, filed Dec. 23, 2011, by Yurchenco et al. and titled, "CHARGING CONTACT SYSTEM" which is hereby incorporated by reference, as if set forth in full in this document, for all purposes.

The present disclosure may also be related to the following commonly assigned application(s)/patent(s):

U.S. patent application Ser. No. 12/773,742, filed May 4, 2010 by Gibson et al. and titled, "Multi-Client Local Network Base Station" (published as US PG Pub. No. 2011/0276885 A1 on Nov. 10, 2011) (hereinafter, the "'742 Application"), which is incorporated herein by reference in its entirety;

U.S. patent application Ser. No. 13/722,902 filed on a date even herewith by Riering-Czekalla et al. and titled "Magnetic Docking Base for Handset", now published as US Patent Application Number 2013/0164949 A1 which claims priority to provisional U.S. Patent Application No. 61/579,884, filed on Dec. 23, 2011, both of which are incorporated by reference herein in their entirety; and U.S. patent application Ser. No. 13/722,908 filed on a date even herewith by Switky et al. and titled "Passive Suction Base", now published as US Patent Application Number 2013/0161460 A1 which claims priority to provisional U.S. Patent Application No. 61/579,886, filed on Dec. 23, 2011, both of which are incorporated by reference herein in their entirety.

The respective disclosures of these applications/patents are incorporated herein by reference in their entirety for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to charging contacts, and more particularly, to waterproof or water-resistant charging contacts for a tablet and/or a handset.

BACKGROUND

Traditionally, docking bases for portable devices, such as portable handsets for telephones, have comprised rigid carriages containing charging contacts protruding upward through openings in the top of the carriages. As a result, spills and dirt can easily enter the docking bases and soon disable it. The docking bases are also difficult to clean. Electronic tablets and handsets are used in a wide range of environments (such as a kitchen, etc.). The docking bases are exposed to spills, dirt, and/or other debris. A need remains for a docking base that is suitably protected against spills and debris for use in a spill- and debris-prone environment and that can be easily cleaned.

In addition, it is desirable to have a docking station suitable for charging both a tablet computer system and a handset.

BRIEF SUMMARY

Various embodiments provide tools and techniques to provide a waterproof charging contact system.

According to some embodiments, the charging contact system may comprise a docking station comprising a first set of compliant charging contacts for a tablet computer system and a second set of compliant charging contacts for a handset computer. In one aspect, each compliant charging contact comprises a charging pin pressed into an elastomer diaphragm inserted within a body of the docking station.

In one aspect, the tablet computer system comprises a first set of static charging contacts configured to mate with the first set of compliant charging contacts. The first set of static charging contacts is flush mounted with a housing of the tablet computer system and forms a water resistant seal with the housing.

In one aspect, the handset comprises a second set of static charging contacts configured to mate with the second set of compliant charging contacts. The second set of static charging contacts is assembled under compression by a rubber foot of the handset.

A method provided by other embodiments might comprise placing the above mentioned tablet on the docking station, so that the first set of static charging contacts is electrically coupled with the first set of compliant charging contacts. In one aspect, the method further comprises placing the above mentioned handset on the docking station, so that the second set of static charging contacts is electrically coupled with the second set of compliant charging contacts.

Various modifications and additions can be made to the embodiments discussed without departing from the scope of the invention. For example, while the embodiments described above refer to particular features, the scope of this invention also includes embodiments having different combination of features and embodiments that do not include all of the above described features.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

FIG. 2A is a front elevation view of a wireless handset and a tablet as shown in FIG. 1, in accordance with various embodiments.

FIG. 2B is a front sectional view of a docking station, a wireless handset, and a tablet, in accordance with various embodiments.

DETAILED DESCRIPTION OF CERTAIN EMBODIMENTS

Figure 1:
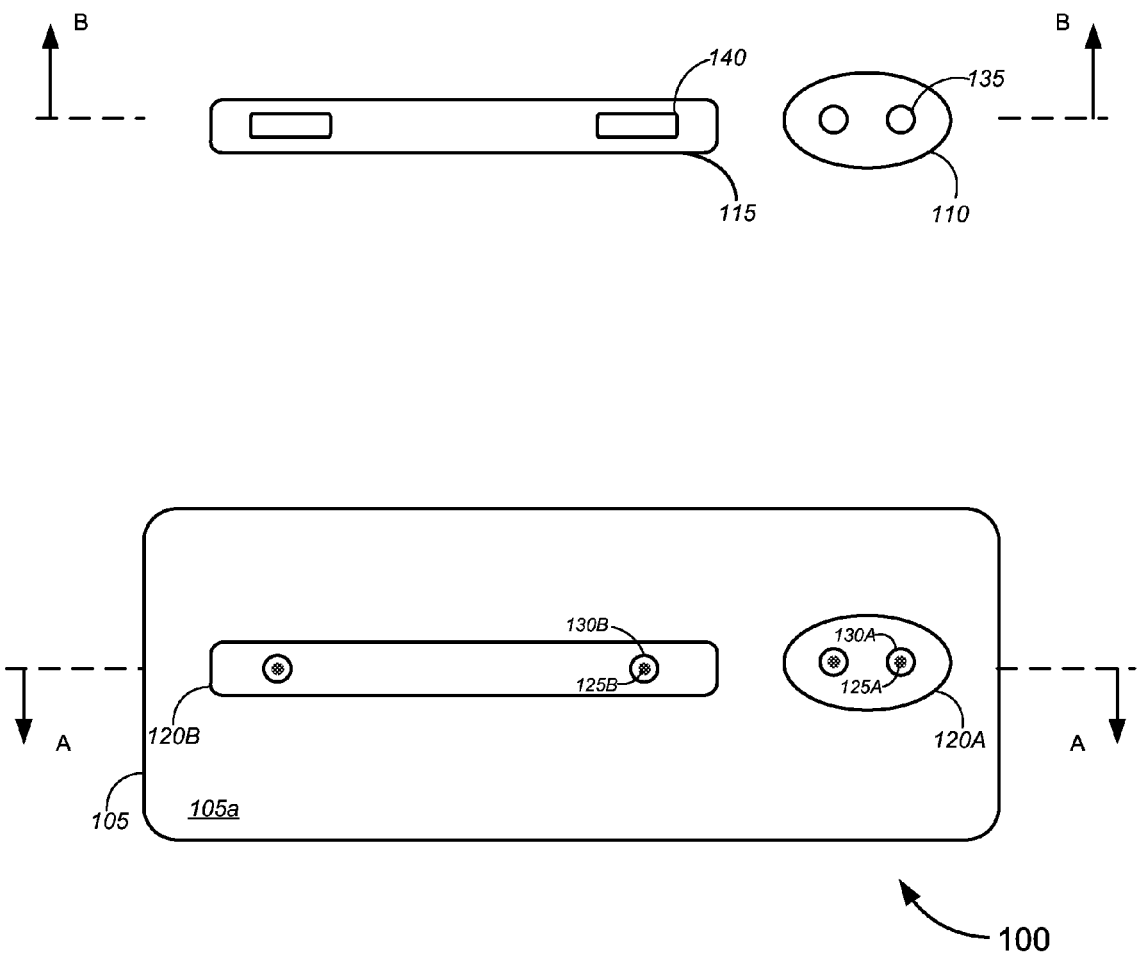
FIG. 1 is a generalized diagram illustrating a top perspective view of a docking station together with a bottom perspective view of a wireless handset and a tablet computer system, in accordance with various embodiments.

While various aspects and features of certain embodiments have been summarized above, the following detailed description illustrates a few exemplary embodiments in further detail to enable one of skill in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present invention may be practiced without some of these specific details. In other instances, certain structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

A set of embodiments provides novel waterproof docking and/or charging solutions for electronic devices. One embodiment can be employed in a tablet computer or similar device. Another embodiment can be employed in a telephone handset, a mobile telephone, a mobile smart phone, or similar device. Merely by way of example, the '742 Application describes a number of communication systems, including base stations, tablet systems, and handset systems, any (or all) of which can employ various embodiments of the docking solutions described herein. These docking solutions can be implemented in conjunction with the charging contact systems described in U.S. patent application Ser. No. 13/722,902 filed on a date even herewith by Riering-Czekalla et al. and titled "Magnetic Docking Base for Portable Device", which claims priority to provisional U.S. Patent Application No. 61/579,884, filed on Dec. 23, 2011, both of which are incorporated by reference herein in their entirety, and U.S. patent application Ser. No. 13/722,908 filed on a date even herewith by Switky et al. and titled "Passive Suction Base", which claims priority to provisional U.S. Patent Application No. 61/579,886, filed on Dec. 23, 2011, both of which are incorporated by reference herein in their entirety.

In accordance with some embodiments of docking/charging system 100, a docking and/or charging station (collectively referred to herein as a "docking station") might have charging pins integrated with deformable materials disposed therein, which can serve as a novel way to waterproof an electrical charging system for wet environments (such as a kitchen, etc.) using suspended contacts (as used herein, the term waterproof should be interpreted to mean water resistant, i.e., impervious to spills and brief contact with liquids, but not necessarily waterproof when submerged, especially under significant pressure). These deformable materials can provide the compliance needed in the charging system. In one aspect, certain embodiments provide flush mounted electrical charging contacts for a tablet system. In another aspect, certain embodiments provide an electrical charging contact compressed with an integral rubber foot. In yet another aspect, certain embodiments provide compliant gasketed charging contacts, Various embodiments can provide numerous benefits. Merely by way of example, certain embodiments can provide a user with a relatively carefree experience, in that the user need not ensure the docking system placed in a fluid and/or debris free environment. Instead, the user need only wipe off fluid and/or debris on the top of the docking system. Moreover, certain embodiments can obviate the need for traditional slots, notches, grooves, etc. to ensure appropriate positioning of the electronic device.

FIGS. 1-5 variously illustrate some of these features. The skilled reader should note that the illustrated devices and systems as shown in FIGS. 1-5 refer to examples of different embodiments that include various components that can be considered alternatives and/or can be used in conjunction with one another in the various embodiments. In some aspects, some of the various embodiments may be the same or similar embodiment. Hence, the description herein of the illustrated devices and systems as shown in FIGS. 1-5 is provided for purposes of illustration and should not be considered to limit the scope of different embodiments.

FIG. 1 is a generalized diagram illustrating a top perspective view of docking station 105 together with bottom perspective views of a wireless handset 110 and a tablet compute system 115, in accordance with various embodiments. (It should be appreciated that such a docking/charging system 100 could be used with any other type of electronic device that requires contact charging (e.g., for batteries internal to the device) and/or communications (e.g., for transferring data between the device and the docking station, or another device in communication with the docking station). In an aspect as shown in FIG. 1, docking station 105 has a generally flat surface 105a onto which electronic devices 110, 115 can be placed. The docking station 105 (or the surface 105a thereof) comprises contact receptacles 120, charging contacts 125, and contact discs 130.

The contact receptacles 120 may be posed in alignment, parallel, perpendicular, or other suitable positions. The contact receptacles 120 can comprise a compliant material (which could include, but is not limited to, elastomeric membranes, rubber, silicone, and/or the like) that is sufficiently strong to support the weight of an electronic device 110 or 115 (such as a wireless handset, a mobile smartphone/telephone, a tablet computer, MP3 player, PDA, etc.), while providing sufficient flexibility and/or deformability to receive (and/or to damp the force applied when docking) the electronic devices 110, 115.

In some embodiments, the contact receptacles 120 comprise an elastomer diaphragm to provide a compliant surface on which the electronic device sits. In alternative embodiments, the contact receptacles 120 may have a rigid (i.e., non-compliant) surface that might be sloped and/or concave in shape, while the contact discs 125 comprise an elastomer diaphragm. The contact receptacle 120, according to some embodiments, may be molded into the surface 105a (e.g., in cases where contact receptacles 120 are rigid), indented or flush-mounted with surface 105a and/or the housing of docking station 105, or mounted via brackets (not shown) in the housing of docking station 105.

The contact discs 130, in some embodiments, may be molded into the surface of the respective contact receptacles 120, formed as part of the contact receptacles 120 (albeit with different conditioning, e.g., different levels of doping or material infusion (as discussed in detail below)), indented, flush-mounted with the contact receptacles 120, compression mounted within contact receptacle 120, or mounted via brackets (not shown) in the respective contact receptacles 120 (e.g., in cases where the contact receptacles 120 are rigid) and/or in the housing of the docking station 105. Merely by way of example, in one embodiment, the contact receptacles 120 might be integrally formed with surface 105a (e.g., via a casting in a mold that forms the surface 105a including the receptacles 120, via machining the surface 105a, including the receptacles 120, into the docking station 105 body, etc.)

A top surface of the contact receptacles 120, according to some embodiments, is flush with surface 105a. In some embodiments, the top surface of the contact receptacles 120 is recessed below surface 105a (i.e., so as to be located below a top surface profile of docking station 105a, as shown, e.g., in FIG. 2B). In some embodiments, the indented contact receptacles 120A, 120B are contoured to mate snuggly against the housing of the handset and the tablet computer system, respectively. According to some embodiments, charging contacts 125 are affixed to the contact receptacle 120 via contact discs 130, as shown in FIG. 1. Charging contacts 125, in other embodiments, are affixed directly to the contact receptacle 120 (in which case, the contact discs 130 might be omitted), for example, in embodiments in which the receptacles 120 themselves are compliant). In some embodiments, affixing the charging contacts 125 to either the contact receptacle 120 or the contact discs 130 may include affixing via frictional force of the elastomeric material on the surface of the charging contacts 125 (e.g., by a compression fit between the elastomeric material of the contact discs 130 and the charging contacts 125), affixing via adhesives (e.g., glue, bonding material, and/or the like), and/or affixing via structures in the charging contacts 125 and/or in the contact receptacles 120/contact discs 130.

In any case, charging contacts 125 might be configured to mate with corresponding charging contacts 135 and 140 in the electronic devices respectively. Charging contacts 135 may be mounted on or otherwise disposed at bottom of the handset 110. Charging contacts 140 may be mounted on or otherwise disposed on any side of the tablet 115. In some embodiments, the charging contacts 140 may cover a portion of edges of the tablet 115 so that the charging contacts 140 may mate with the charging contacts 125B at a tilted position. The docking station 105 might be connected with a power source (such as a 110V or 220V outlet) and might include the necessary transformers, current regulators, and/or the like to condition the power for use by the electronic device 110, as appropriate. Alternatively and/or additionally, the docking station 105 might feature a connection (such as a USB connection) with a personal computer or other device, which can serve as a power source and/or can exchange data with the docking station 105 (and by extension, any devices connected thereto, such as the tablet 115 and/or handset 110). When the charging contacts 135, 140 of the electronic devices are placed in contact with the charging contacts 125, current flows through the contacts to provide power to the electronic device. This power can be used to power the device 110, 115 (e.g., tablet or handset, etc.), and/or charge a battery of the device, etc.

According to some embodiments, charging contacts 125 (or at least a top-portion thereof) can be generally spherical in shape (or at least convex-hemispherical), while charging contacts 135 (or at least a bottom-portion thereof) might be flat, or concave-hemispherical, where the concave-hemispherical charging contacts 135 match or complement the convex-hemispherical charging contacts 125A. In some embodiments, precise matching of the shapes of the charging contacts 125A and 135 is not necessary, so long as contact is made (e.g., the top-most point of charging contacts 125A touching some portion of the charging contacts 135 due to the electronic device 110 resting on contact receptacle 120A (and particularly on charging contacts 125A) at least in part due to gravity, magnetic attraction, and/or the like). Although the illustrated charging contacts 125 are generally spherical in shape, the various embodiments are not so limited. The charging contacts 125 may be any shape, and in particular embodiments, any polygonal three-dimensional shape. Each charging contact 125, according to some embodiments, may be pole-like or cylindrical with at least one rounded (or hemispherical) tip that is configured to make contact with charging contacts 135, 140. Each charging contact 125, according to other embodiments, may be pole-like or cylindrical with at least one polygonal three-dimensional shape (e.g., a triangular pyramid, square pyramid, a cone, a bullet, a mushroom, or a dumbbell etc.) that mates with a correspondingly shaped charging contact 135 or 140.

In some alternative embodiments, the charging contacts 125 may be formed in the shape of mushroom. In such embodiments, the "stem" (or bottom cylinder part of the charging contact) can have a perimeter that forms a friction fit inside the annular opening of the contact discs 130. The top hemispherical part of the charging contact might have a perimeter greater than that of the annular the opening of the contact discs 130, such that the hemispherical portion rests on top of a portion of the disc 130, with the "stem" extending into and/or through the annular opening of the discs.

In alternative embodiments, the charging contacts 125 may be formed in the shape of dumbbell. The central cylinder part of the charging contacts 125 might have a perimeter forming a friction fit with the annular opening of the contact discs 130. The two ends of the dumbbell-shaped charging contacts 125 might have a perimeter greater than the annular opening of the contact discs 130. The contact discs may have a thickness mating tightly with the two ends of the charging contact.

In alternative embodiments, charging contacts 135, 140 might be flat, while charging contacts 125 might have a protruding point (e.g., a top portion having a shape including one of a hemisphere, rounded cone tip, or point). In such embodiments, compliance might be achieved by the flat charging contacts 135 of device 110 pushing down on the protruding charging contacts 125A, which might be pressed down against the flex of contact discs 130A that support charging contacts 125A, such that a foot portion (or rubber foot) of device 110 mates with contact receptacle 120A.

According to some embodiments, the contact receptacle 120A, the charging contacts 125A, and the contact discs 130A form a tight fit with the housing of the docking station 105 and with each other, to create a waterproof or water-resistant seal, maintaining a water-resistant nature of the housing while still allowing contact charging. In some cases, this fit may be sealed with a sealant as necessary to ensure water resistance. Using this technique, the electronic device 110 might have a rubber or elastomeric foot or base, which can provide several benefits (such as a compliant surface on which the electronic device 110 can sit, as well as providing friction with the contact receptacle 120A on which the electronic device 110 sits), although this is not required: in other embodiments, the foot or base of the device 110 might be non-compliant. In any case, the charging contacts 135 on the electronic device 110 might be assembled under compression to create a seal (i.e., a water-proof seal) between charging contacts 135 and the integral rubber foot and/or a compliant portion thereof (which might be similar to the contact discs 130 of the docking station 105.

Turning to FIG. 2, FIG. 2A is a front elevation view of the wireless handset 110 and the tablet computer system 115, e.g., as shown in FIG. 1, in accordance with various embodiments. FIG. 2B is a front sectional view of docking station 105 as shown, e.g., along section line A-A in FIG. 1 and a partial front sectional view of handset 110 and tablet 115 as shown, e.g., along section line B-B in FIG. 1, in accordance with various embodiments. FIG. 2B illustrates in sectional view how the electronic device 110, 115 (e.g., a wireless handset, a tablet computer system) can mate with docking station 105. In particular, the base of wireless handset 110 (as shown in FIG. 2A) has flat charging contacts 135 disposed thereon. When the wireless handset 110 is placed on contact receptacle 120A, the contact discs 130A may deform sufficiently so that the handset 110 sits on the contact receptacle 120A. Edges of the contact receptacle may mate snuggly with portion of the handset housing. In one embodiment, edges of the contact receptacle are made of deformable materials, and may form a substantially waterproof seal with housing of the handset. In one embodiment, gravity from the handset is sufficient to depress the deformable material to mate with the housing of the handset. In another embodiment, extra depression may be required.

Although FIG. 2B (as well as various other figures throughout this document) shows contact discs 130 as being disposed below a surface of the receptacles 120, the various embodiments are not so limited. The contact receptacles 120 and contact discs 130 may be of similar thickness but comprising materials having different flexibility and deformability. For example, contact receptacle 120 may be made of less yielding materials, while contact discs 130 may be made of more yielding materials. Thickness of the materials is only one variable that controls the differences in flexibility and deformability between the contact receptacle 120 and the contact discs 130. In some embodiments, the contact receptacle 120 and contact discs 130 may be made of a single piece of elastomeric, rubber, or silicone material, where portions thereof corresponding to the location of each of the respective components (i.e., contact receptacles 120 and contact discs 130) may be doped or infused with materials or chemical components (such as those known to a skilled person in the art) so as to achieve the desired variances in flexibility and deformability. Alternatively, in some cases, the contact discs 130 might be omitted, and the contact receptacle 120 might hold the charging contacts 125.

In some embodiments, contact receptacle 120 may be attached or affixed to surface 105a via adhesives and/or mechanical fasteners, clamps, or brackets (as may be known to those skilled in the art). Likewise, contact discs 130 may be attached or affixed to contact receptacle 120 via adhesives and/or mechanical fasteners, clamps, or brackets (as may also be known to those skilled in the art). Such attachment, according to some embodiments, may result in a top surface of at least one of the contact receptacle 120 or the contact discs 130 being flush with the surface 105a. In some embodiments, the top surface of at least one of the contact receptacle 120 or the contact discs 130 may be recessed below the surface 105a (i.e., so as to be within an interior space of docking station 105). The indented contact receptacle 120A may be contoured to mate snuggly with portion of the handset housing.

Figure 3:
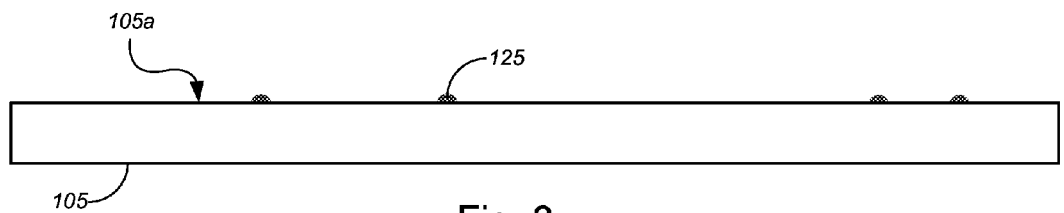
FIG. 3 is a front elevation view of a docking station, in accordance with various embodiments.

FIG. 3 is a front elevation view of a docking station 105, in accordance with various embodiments. As shown in FIG. 3, from a front elevation view of the docking station 105, portions of charging contacts 125 may extend above the top surface 105a profile of the docking station 105. Alternatively, the top surface of the charging contacts 125 might be disposed entirely within the profile of the receptacle 120, such that the charging contacts 125 do not extend above the top surface 105a profile of the docking station 105.

Figure 4:
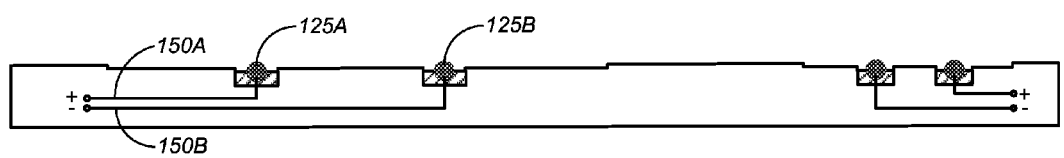
FIG. 4 is a front sectional view of a docking station, in accordance with various embodiments.

FIG. 4 is a front sectional schematic diagram of a docking station 105 e.g., as shown along the A-A section line in FIG. 1, in accordance with various embodiments. In various embodiments as illustrated by FIG. 4, one of the charging contacts 125A is operatively coupled to a positive (+) terminal, while the other of the charging contacts 125A is operatively coupled to a negative (−) terminal, in order to supply current to an electronic device that is docked with docking station 105 for the purpose of powering the electronic device and/or charging batteries housed therein. Operative coupling of the charging contacts 135/140 to the positive/negative terminals may, in some embodiments, be achieved via wires 150 that are electrically affixed to respective charging contacts 125, as shown in FIG. 4.

Figure 5:
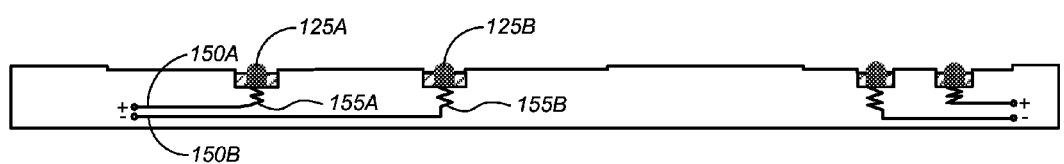
FIG. 5 is a front sectional view of a docking station, in accordance with various embodiments.

As shown in FIG. 5, in some alternative embodiments, each of the wires 150 that are connected to one of the positive or negative terminals may be attached to a corresponding spring 155 (or telescoping platform or cylinder) that comprises a conductive material and makes contact with a respective one of charging contacts. The springs 155 may be biased between an inner surface of the docking station 105 and the charging contacts 125, and/or may provide additional support to the contact receptacle 120 when an electronic device 110 or 115 is docked with the docking station 105.

While certain features and aspects have been described with respect to exemplary embodiments, one skilled in the art will recognize that numerous modifications are possible. For example, while various embodiments described herein may be described with respect to particular structural and/or functional components for ease of description, methods provided by various embodiments are not limited to any particular structural and/or functional architecture but instead can be implemented on any suitable embodiments. Similarly, while certain functionality is ascribed to certain system components, unless the context dictates otherwise, this functionality can be distributed among various other system components in accordance with the several embodiments.

Moreover, system components described according to a particular structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to a particular embodiment can be substituted, added and/or subtracted from among other described embodiments, unless the context dictates otherwise. Consequently, although several exemplary embodiments are described above, it will be appreciated that the invention is intended to cover all modifications and equivalents within the scope of the following claims.

What is claimed is:

1. A docking station, comprising:
   a first set of compliant charging contacts for a tablet computer system; and a second set of compliant charging contacts for a handset computer system;

wherein each compliant charging contact comprises a charging pin pressed into a deformable layer inserted within a body of the docking station.

2. The docking station according to claim 1, wherein the docking station is substantially planar.

3. The docking station according to claim 1, wherein the deformable layer comprises an elastomer diaphragm.

4. The docking station according to claim 1, wherein the deformable layer compresses when the charging pins are depressed.

5. The docking station according to claim 1, wherein the deformable layer is molded with the body of the docking station.

6. The docking station according to claim 1, further comprising:

an indented contact receptacle;

wherein the contact receptacle is contoured to mate snugly against portion of a housing of an electrical device.

7. The docking station according to claim 6, wherein the indented contact receptacle is deformable.

8. The docking station according to claim 6, wherein the deformable layer is more flexible than the contact receptacle.

9. The docking station according to claim 6, wherein the deformable layer forms a seal about the contact receptacle and the charging pin.

10. The docking station according to claim 6, wherein the deformable layer is molded with the contact receptacle.

11. The docking station according to claim 6, wherein the deformable layer is surrounded by the contact receptacle.

12. The docking station according to claim 1, wherein the top of the docking station is water resistant.

13. The docking station according to claim 1, wherein the charging pin is integral to and protrudes outwardly from the deformable layer.

14. The docking station according to claim 1, wherein the charging pin is affixed to an elastic spring.

15. The docking station according to claim 14, wherein the elastic spring provides electrical conductivity.

16. The docking station according to claim 1, wherein the deformable layer is in a shape of a disc.

17. The docking station according to claim 1, wherein the charging pin is in a shape of a dumbbell.

18. A communication system, comprising:

a docking station comprising a first set of compliant charging contacts for a tablet computer system and a second set of compliant charging contacts for a handset computer system, each compliant charging contact comprising a charging pin pressed into an elastomer diaphragm inserted within a body of the docking station;

the tablet computer system, comprising a first set of static charging contacts configured to mate with the first set of compliant charging contacts, the first set of static charging contacts being flush mounted with a housing of the tablet computer system and forming a water resistant seal with the housing; and the handset, comprising a second set of static charging contacts configured to mate with the second set of compliant charging contacts, the second set of static charging contacts being assembled under compression by a rubber foot of the handset.

19. The communication system according to claim 18, further comprising:

a first indented contact receptacle; and a second indented contact receptacle;

wherein the first contact receptacle is contoured to mate snugly against portion of the housing of the tablet computer system;

wherein the second contact receptacle is contoured to mate snugly against the rubber foot of the handset.

20. A method for use with a communication system comprising a docking station comprising a first set of compliant charging contacts for a tablet computer system and a second set of compliant charging contacts for a handset computer system, each compliant charging contact comprising a charging pin pressed into an elastomer diaphragm inserted within a body of the docking station, the tablet computer system, comprising a first set of static charging contacts configured to mate with the first set of compliant charging contacts, the first set of static charging contacts being flush mounted with a housing of the tablet computer system and forming a water resistant seal with the housing, the handset comprising a second set of static charging contacts configured to mate with the second set of compliant charging contacts, the second set of static charging contacts being assembled under compression by a rubber foot of the handset, the method comprising:

placing the tablet system on the docking station, so that the first set of static charging contacts is electrically coupled with the first set of compliant charging contacts, wherein, when the tablet system is placed in the docking station, the elastomer diaphragm deforms when the charging pin is depressed, to create a seal; and placing the handset on the docking station, so that the second set of static charging contacts is electrically coupled with the second set of compliant charging contacts, wherein, when the handset is placed in the docking station, the elastomer diaphragm deforms when the charging pin is depressed, to create a seal.

\* \* \* \* \*